(12) United States Patent
Garcia et al.

(10) Patent No.: US 11,994,836 B2
(45) Date of Patent: May 28, 2024

(54) SMART CIRCUIT INTERRUPTER ACCESSORIES APPLIED POWER DIAGNOSTICS

(71) Applicant: Eaton Intelligent Power Limited, Dublin (IE)

(72) Inventors: Patrick Martinez Garcia, Santo Domingo (DO); Paul R. Rakus, Coraopolis, PA (US); James L. Lagree, Robinson Township, PA (US); David R. Rohn, Venetia, PA (US); Kevin Sippel, Burlington, KY (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 203 days.

(21) Appl. No.: 17/204,297

(22) Filed: Mar. 17, 2021

(65) Prior Publication Data
US 2022/0299971 A1    Sep. 22, 2022

(51) Int. Cl.
*G05B 19/406* (2006.01)
*G05B 19/042* (2006.01)
(Continued)

(52) U.S. Cl.
CPC ......... *G05B 19/406* (2013.01); *G05B 19/042* (2013.01); *H02H 1/0007* (2013.01);
(Continued)

(58) Field of Classification Search
USPC ......................................................... 700/293
See application file for complete search history.

(56) References Cited

U.S. PATENT DOCUMENTS

| 4,412,284 A | * | 10/1983 | Kerforne | ............. | G06F 11/1441 |
| | | | | | 714/22 |
| 5,729,119 A | | 3/1998 | Barbour | | |

(Continued)

FOREIGN PATENT DOCUMENTS

| EP | 1 939 915 A2 | 7/2008 | | |
| WO | 2017/178325 A1 | 10/2017 | | |
| WO | WO-2017178325 A1 | * | 10/2017 | ......... G01R 31/3272 |

OTHER PUBLICATIONS

European Patent Office, "extended European search report" for corresponding European Application No. 22162601.3, dated Aug. 22, 2022, 9 pp.

(Continued)

*Primary Examiner* — Mohammad Ali
*Assistant Examiner* — Joshua T Sanders
(74) *Attorney, Agent, or Firm* — Eckert Seamans Cherin & Mellott, LLC (57) ABSTRACT

A smart accessory device is designed to be used with a circuit breaker so as to be able to actuate an operating mechanism of the circuit breaker in order to either open or close the separable contacts of the circuit breaker. The accessory device can be one of a shunt trip, spring release, or under voltage release device. The accessory device continually executes diagnostics to determine whether the power being supplied by an external power source is sufficient to enable the accessory device to actuate the operating mechanism of the associated circuit breaker. If the accessory device determines that the power being supplied by the external source is insufficient, the device triggers an alarm in order to notify a user that the power source is not meeting the power requirements of the device.

18 Claims, 6 Drawing Sheets

(51) Int. Cl.
*H02H 1/00* (2006.01)
*H02H 3/08* (2006.01)

(52) U.S. Cl.
CPC ............ *H02H 1/0092* (2013.01); *H02H 3/08* (2013.01); *G05B 2219/21151* (2013.01); *G05B 2219/34465* (2013.01)

(56) References Cited

U.S. PATENT DOCUMENTS

| | | | |
|---|---|---|---|
| 2008/0156791 A1* | 7/2008 | Finney | H01H 71/123 |
| | | | 219/685 |
| 2015/0276877 A1 | 10/2015 | Biswas et al. | |
| 2016/0103180 A1 | 4/2016 | Ricciuti | |
| 2020/0363474 A1 | 11/2020 | Zhang et al. | |

OTHER PUBLICATIONS

European Patent Office, "International Search Report and Written Opinion" for corresponding PCT Application No. PCT/EP2022/025110, dated Jul. 20, 2022, 13 pp.

* cited by examiner

SMART CIRCUIT INTERRUPTER ACCESSORIES APPLIED POWER DIAGNOSTICS

BACKGROUND

Field

The disclosed concept relates generally to diagnostics systems for circuit breaker accessories and in particular, to systems for monitoring the sufficiency of applied power supplied to shunt trip, spring release, and under voltage release devices.

Background Information

Circuit interrupters, such as for example and without limitation, circuit breakers, are typically used to protect electrical circuitry from damage due to an overcurrent condition, such as an overload condition, a short circuit, or another fault condition, such as an arc fault or a ground fault. Circuit breakers typically include separable contacts. The separable contacts may be operated either manually by way of an operator handle or automatically in response to a detected fault condition. Typically, such circuit breakers include an operating mechanism, which is designed to rapidly open and close the separable contacts, and a trip mechanism, such as a trip unit, which senses a number of fault conditions to trip the breaker automatically. Upon sensing a fault condition, the trip unit causes the operating mechanism to trip open the separable contacts.

Circuit breaker accessories such as shunt trip, spring release, and under voltage release devices can be operatively connected to a circuit breaker and used to open and close the separable contacts. A shunt trip assembly typically includes a conductive coil and armature operating mechanism that is coupled to the circuit breaker operating mechanism by a mechanical linkage such that movement in the shunt trip operating mechanism causes corresponding movement in the circuit breaker operating mechanism. The shunt trip assembly is additionally operatively coupled to a remote power source that is structured to energize the coil and actuate the shunt trip operating mechanism such that an operator at a remote location can open the circuit breaker separable contacts. An under voltage release device includes a conductive coil connected to a spring, wherein the coil requires a continuous power supply to maintain the spring in a position that keeps the separable contacts of circuit breaker closed and consequently trips the circuit breaker open when supply voltage to the under voltage release device drops below a threshold voltage. A spring release device comprises a coil and armature operating mechanism that causes a compressed spring to expand when the coil is energized by a voltage input and can remotely cause the operating mechanism of a circuit breaker to close the separable contacts by expanding the compressed spring.

As with any electrical or mechanical components, the components of circuit breaker accessory devices such as shunt trip, spring release, and under voltage release devices can malfunction and/or wear down. Malfunctioning and wearing down of the accessory devices can in turn prevent the circuit breaker from operating properly. When a circuit breaker fails to operate properly, determining whether the issue lies within the components of the circuit breaker or the components of a connected accessory device can be time-consuming and inefficient.

There is thus room for improvement in diagnostics systems for circuit breaker accessory devices.

SUMMARY

Accordingly, it is an object of the present invention to provide, in an exemplary embodiment, a smart accessory device structured to be operatively connected to a circuit breaker and actuate an operating mechanism of the circuit breaker that includes: a power section structured to be electrically connected to a power source, the power section comprising an actuator structured to actuate the operating mechanism of the circuit breaker, a current sensor structured to sense a current provided by the power source to the accessory device, and a voltage sensor structured to sense a voltage provided by the power source to the accessory device; and a control section electrically and operatively connected to the power section, the control section comprising a processor. The processor is configured to monitor a power provided by the power source to the accessory device based on information received from the current sensor and based on information received from the voltage sensor. The processor is also configured to determine whether the power provided by the power source to the accessory device is sufficient to enable the accessory device to actuate the operating mechanism of the circuit breaker.

In another exemplary embodiment, a smart accessory device structured to be operatively connected to a circuit breaker and actuate an operating mechanism of the circuit breaker that includes: a power section structured to be electrically connected to a power source, the power section comprising an actuator structured to actuate the operating mechanism of the circuit breaker, a current sensor structured to sense a current provided by the power source to the accessory device, and a voltage sensor structured to sense a voltage provided by the power source to the accessory device; and a control section electrically and operatively connected to the power section, the control section comprising a processor. The processor is configured to monitor a power provided by the power source to the accessory device based on information received from the current sensor and based on information received from the voltage sensor. The processor is also configured to continually execute a number of diagnostics as long as power is being supplied to the accessory device to determine whether the power provided by the power source to the accessory device is sufficient to enable the accessory device to actuate the operating mechanism of the circuit breaker.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Directional phrases used herein, such as, for example, left, right, front, back, top, bottom and derivatives thereof, relate to the orientation of the elements shown in the drawings and are not limiting upon the claims unless expressly recited therein.

As used herein, the singular form of "a", "an", and "the" include plural references unless the context clearly dictates otherwise.

As used herein, the statement that two or more parts or components are "coupled" shall mean that the parts are joined or operate together either directly or indirectly, i.e., through one or more intermediate parts or components, so long as a link occurs. As used herein, "directly coupled" means that two elements are directly in contact with each other. As used herein, "fixedly coupled" or "fixed" means that two components are coupled so as to move as one while maintaining a constant orientation relative to each other. As used herein, "movably coupled" means that two components are coupled so as to allow at least one of the components to move in a manner such that the orientation of the at least one component relative to the other component changes.

As employed herein, the term "number" shall mean one or an integer greater than one (i.e., a plurality).

As employed herein, the term "processor" shall mean a programmable analog and/or digital device that can store, retrieve and process data; a controller; a control circuit; a computer; a workstation; a personal computer; a microprocessor; a microcontroller; a microcomputer; a central processing unit; a mainframe computer; a mini-computer; a server; a networked processor; or any suitable processing device or apparatus.

Figure 1:
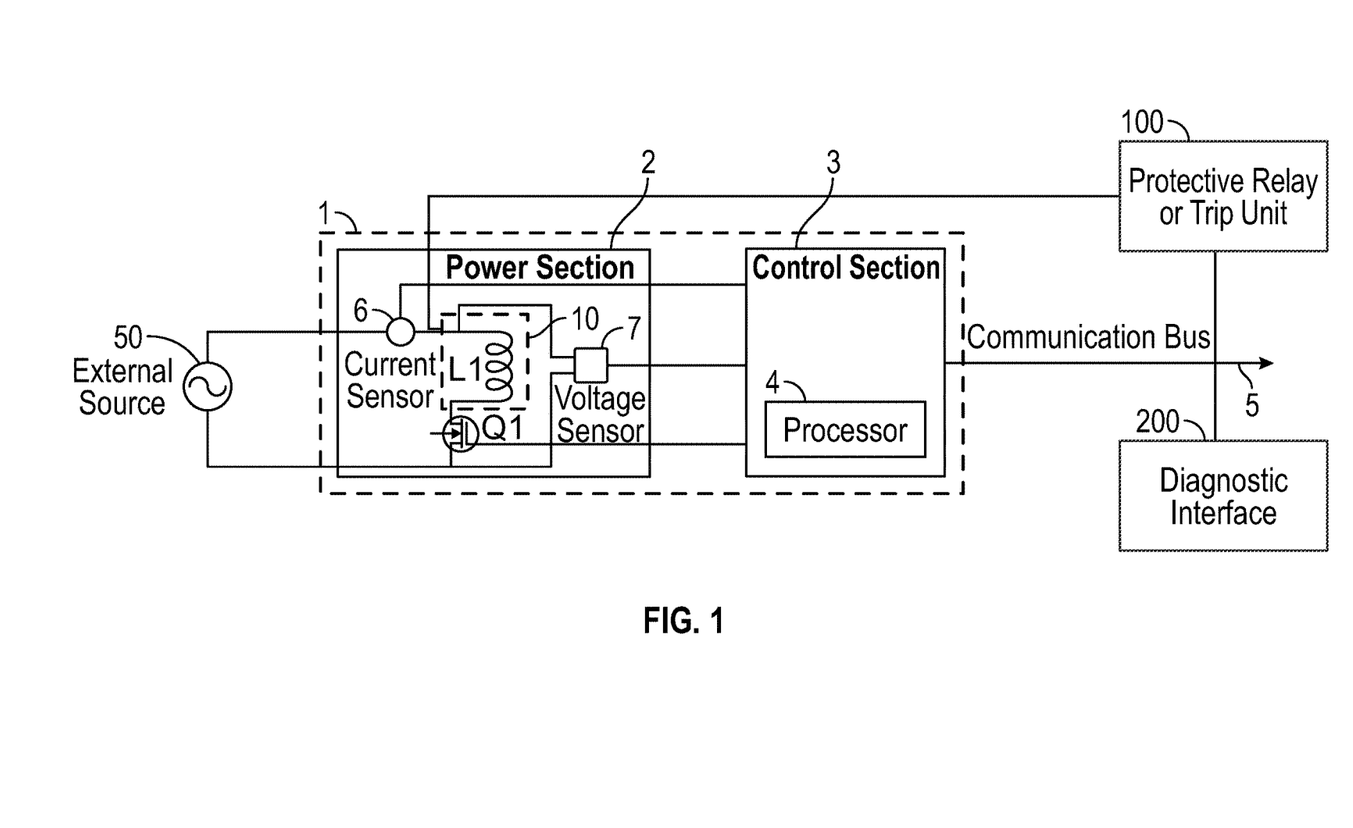
FIG. 1 is a schematic diagram of a smart circuit breaker accessory device in accordance with an example embodiment of the disclosed concept.

FIG. 1 shows a schematic depiction of a smart accessory 1 structured to be operatively coupled to a protective relay or trip unit 100 of a circuit breaker according to an exemplary embodiment of the disclosed concept. For economy of disclosure, the protective relay or trip unit 100 will be referred to hereinafter as the trip unit 100, but it will be appreciated that the trip unit 100 can instead or additionally comprise a protective relay without departing from the scope of the disclosed concept. The trip unit 100 trips open the separable contacts of the associated circuit breaker (not pictured) upon detection of a fault condition. Accessory 1 can be, for example and without limitation, a shunt trip, spring release, or under voltage release device structured to be used with the circuit breaker associated with the trip unit 100.

Accessory 1 comprises a power section 2 and a control section 3, the power section 2 and the control section 3 each containing electrical circuitry and being in electrical communication with and operatively coupled to one another. The control section 3 further comprises a processor 4, which performs diagnostic functions for the accessory 1 as described in more detail herein with respect to FIG. 4 and FIG. 6. In addition, circuit breaker accessory devices such as accessory 1 are often powered by external power sources, and the power section 2 is in direct electrical communication with an external power source 50, while the control section 3 is in direct electrical communication with a communication bus 5 that enables communication between the accessory 1 and any other entity connected to the bus 5.

Non-limiting examples of entities that can be connected to the bus 5 include the trip unit 100 (including the supervisory intelligence of the trip unit or protective relay) and a diagnostic interface 200 through which a user can receive information provided by the accessory 1 about the state of the accessory 1. It will be appreciated that the schematic depiction of the accessory 1, the trip unit 100, and the diagnostic interface 200 in FIG. 1 is meant to be illustrative and is not intended to be limiting on the scope of the disclosed concept. For example, the diagnostic interface 200 is depicted as being a separate component from the trip unit 100, but both the diagnostic interface 200 and the trip unit 100 can be included in the same physical structure housing the associated circuit breaker without departing from the scope of the disclosed concept.

For economy of disclosure, the power section 2 and the control section 3 are depicted in a simplified manner in FIG. 1, as are the elements of the power section 2 schematically shown in FIG. 1, and it will be appreciated that the elements of the power section 2 shown in FIG. 1 are illustrative and not intended to limit the scope of the disclosed concept. In particular, a current sensor 6 and a voltage sensor 7 are included in the power section 2 so that the control section 3 can monitor the current and voltage being supplied by the external power source 50 to the accessory 1, but the specific implementations of the current sensor 6 and voltage sensor 7 shown in FIG. 1 are illustrative in nature and intended to be non-limiting. For example, the current sensor 6 is depicted as being in series between the power source and an input terminal of an inductor L1 (which also represents an actuator 10 of the accessory 1 as described with respect to FIG. 2 herein), but the current sensor 6 can be placed elsewhere in the power section 2 and more than one current sensor can be included in the power section 2 without departing from the scope of the disclosed concept. In another example, the voltage sensor 7 is depicted as being in parallel with the series-connected actuator 10 (inductor L1) and MOSFET Q1, but the voltage provided by the external power source 50 can be measured using elements other a MOSFET in series with the actuator 10 without departing from the scope of the disclosed concept.

Figure 2A:
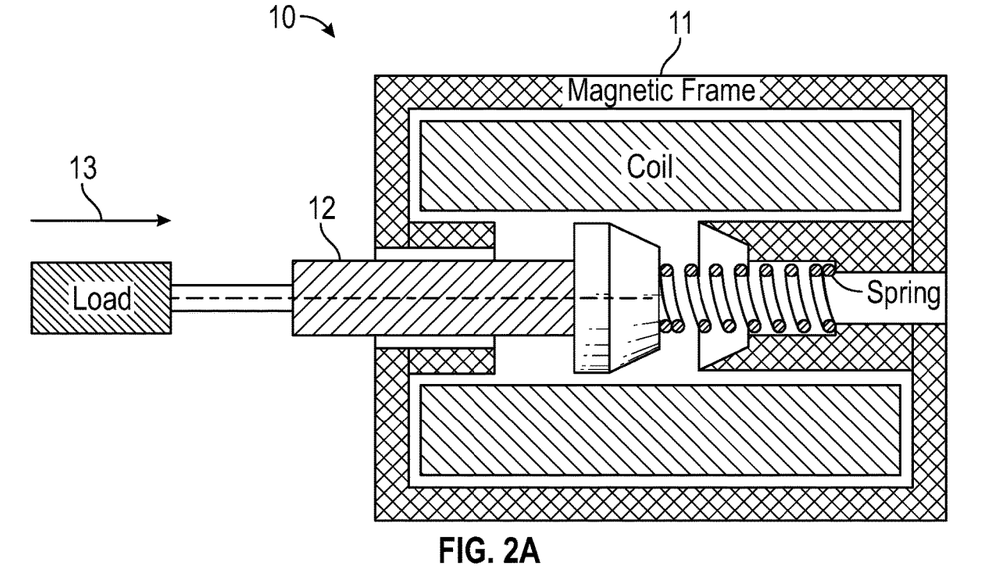
FIG. 2A shows a cross-sectional view of a pull-type solenoid and plunger arrangement used as an actuator in the accessory device shown in FIG. 1 in accordance with an example embodiment of the disclosed concept.
Figure 2B:
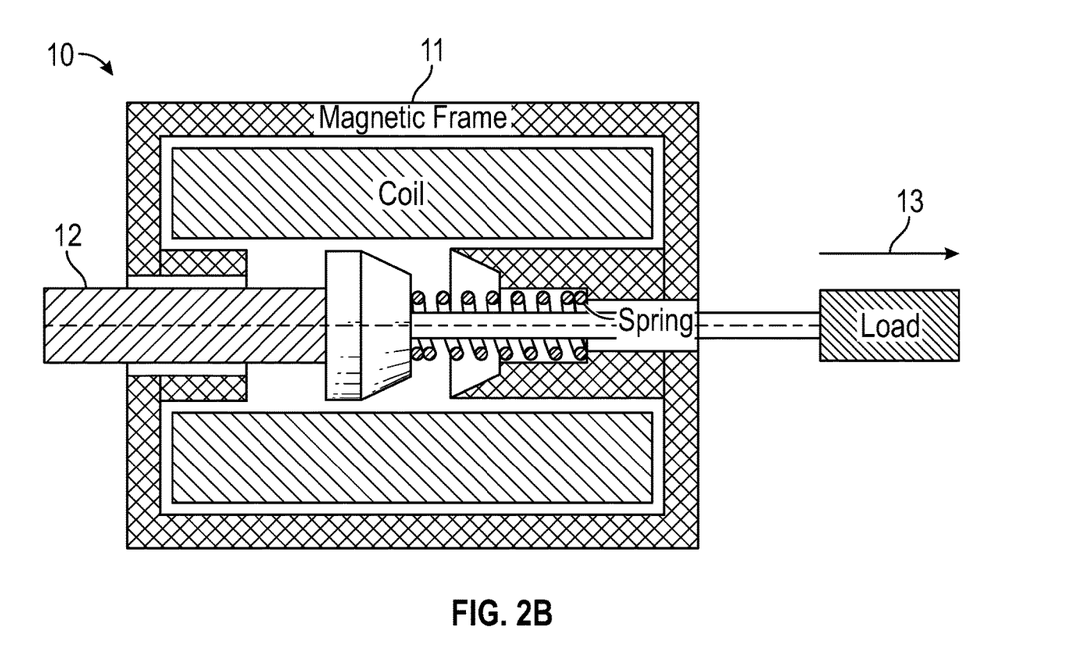
FIG. 2B shows a cross-sectional view of a push-type solenoid and plunger arrangement used as an actuator in the accessory device shown in FIG. 1 in accordance with an example embodiment of the disclosed concept.

Still referring to FIG. 1, the actuating mechanism of the shunt trip, spring release, and under voltage release devices that an accessory 1 can comprise often includes a solenoid and plunger arrangement, such as the actuator 10 shown in FIGS. 2A and 2B. Referring to FIGS. 2A and 2B, which show a cross-sectional view of a solenoid 11 and a plunger 12, the solenoid 11 comprises a coil of conductive wire wound around a bobbin and enclosed by a magnetic frame (none of these components being numbered), with the ends of the coil structured to be electrically connected to a power source such as the external power source 50. The plunger 12 is produced from ferromagnetic material and is mechanically coupled to the solenoid 11. When power is provided to the solenoid 11 and current flows through the coil, a magnetic field is generated and actuates the plunger 12 to move in the direction denoted by the arrow 13.

A load 20 can be coupled to the plunger 12, such that the plunger 12 either acts as a pull-type plunger (shown in FIG. 2A) or a push-type plunger (shown in FIG. 2B) when actuated. For example, a solenoid 11 used in an under voltage release device is generally coupled to a pull-type plunger 12 as shown in FIG. 2A, while a solenoid 11 used in a shunt trip or spring release device is generally coupled to a push-type plunger 12 as shown in FIG. 2B. However, whether the type of plunger 12 coupled to a solenoid 11 included in an accessory device 1 is a pull-type or push-type is not intended to limit the scope of the disclosed concept. In addition, an optional spring is sometimes coupled to the solenoid frame as well (as shown in FIG. 2A and FIG. 2B), particularly in under voltage release devices. In the context of circuit breaker accessory devices, if the accessory 1 is a shunt trip or under voltage release device, the load 20 coupled to the plunger 12 is generally a component that actuates the circuit breaker operating mechanism to open the separable contacts, and if the accessory 1 is a spring release device, the load 20 coupled to the plunger 12 is generally a component that actuates the circuit breaker operating mechanism to close the separable contacts.

The accessory 1 can only function properly to actuate the circuit breaker operating mechanism if sufficient power is provided to the actuator 10. The actuator 10 of the accessory 1 is depicted in FIGS. 2A and 2B as comprising a solenoid 11 and a plunger 12 for economy of disclosure, as several types of circuit breaker accessory devices use a solenoid 11 and plunger 12 as actuators, however, it will be appreciated that other types of actuators can be used in place of a solenoid 11 and plunger 12 without departing from the scope of the disclosed concept.

Figure 3A:
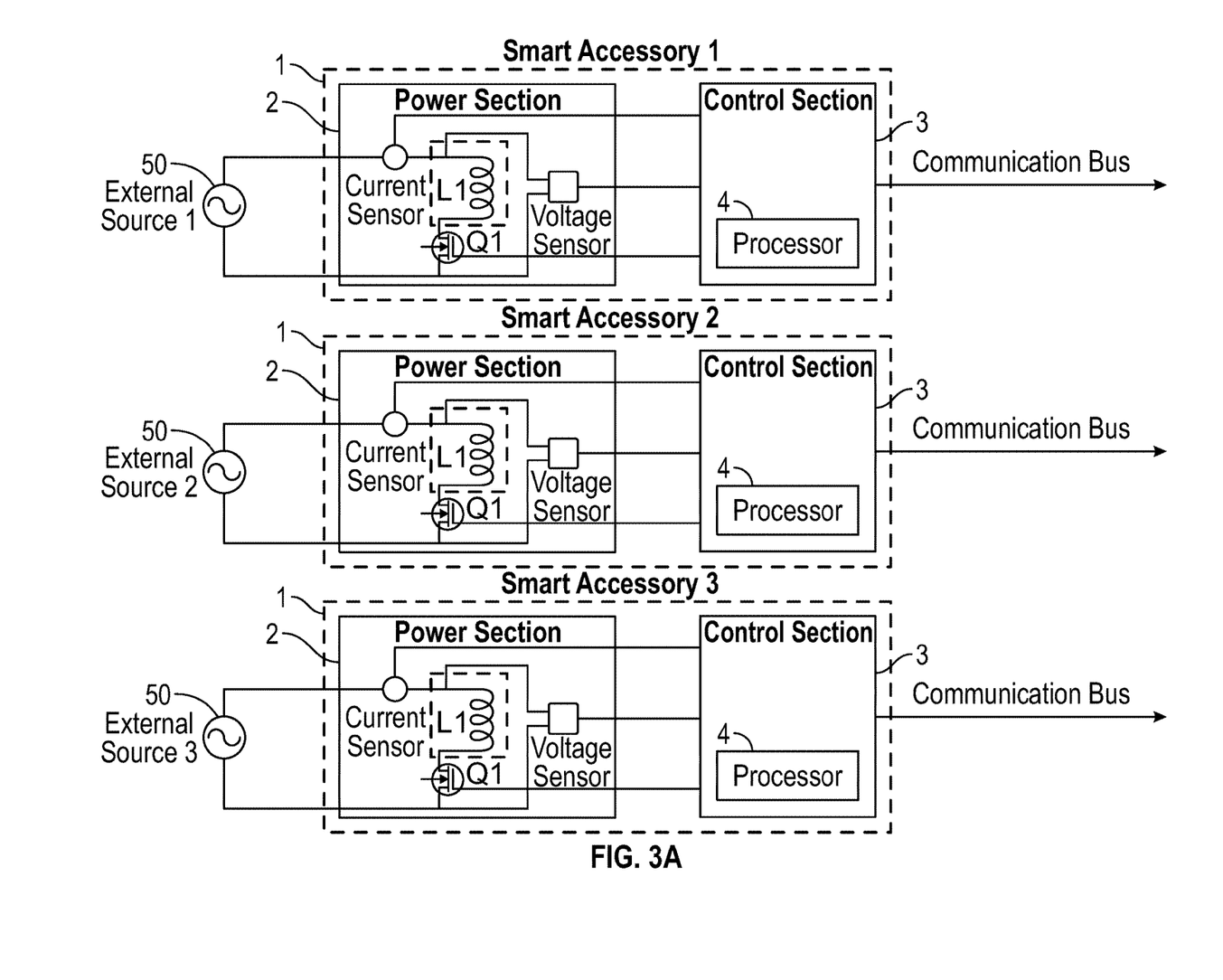
FIG. 3A is a schematic diagram of a plurality of the circuit breaker accessory device shown in FIG. 1, with each of the plurality of accessory devices being connected to its own designated external power source.
Figure 3B:
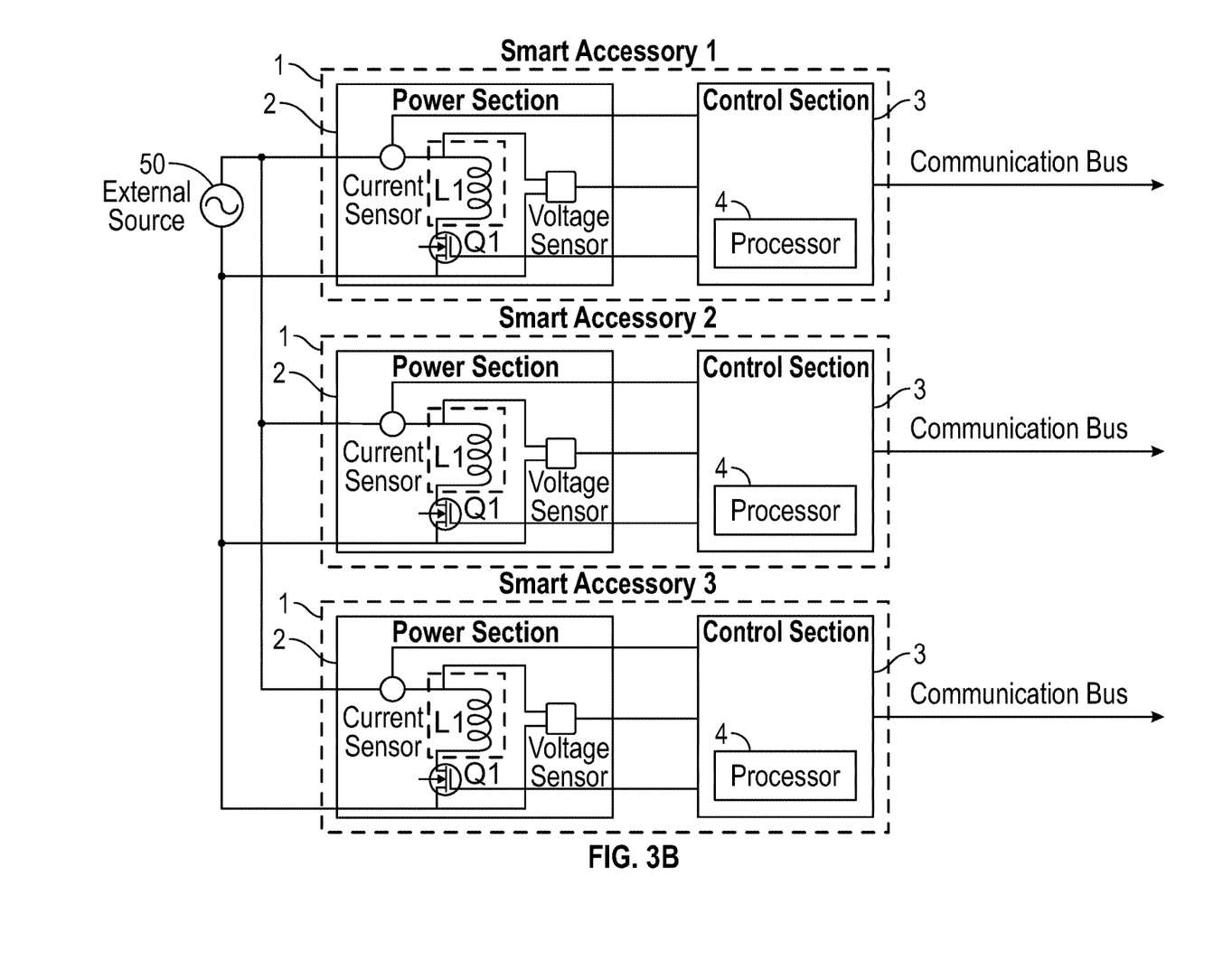
FIG. 3B is a schematic diagram of a plurality of the circuit breaker accessory device shown in FIG. 1, with all of the accessory devices being connected to a single external power source.

Referring to FIG. 3A, when more than one accessory 1 is connected to a circuit breaker, it is ideal to connect each accessory 1 to its own designated external power source 50. In practice, it is not always possible to provide each accessory 1 with its own external power source 50, and multiple accessories 1 need to be connected to the same external power source 50, as shown in FIG. 3B. For each accessory 1 to actuate reliably, the external power source 50 must be able to supply a minimum amount of current to each of the solenoids 11 of the accessories 1 connected to the external power source 50 on demand. In operation, the external power source 50 may only be able to supply sufficient power for fewer solenoids 11 at one time than are connected to the external power source 50. Even when each accessory 1 is connected to its own designated external power source 50 as shown in FIG. 3A, a user may inadvertently connect the accessory 1 to an external power source 50 that is under-rated for the power consumption requirements of the accessory solenoid 11 (or other power-consuming components of the connected accessory 1), or a wiring error may exist and lower the output of the external power source 50 to the accessory 1. It is therefore an object of the present disclosure to provide a diagnostic mechanism that can alert a user in real time that the power provided by the external power source 50 to an accessory 1 is insufficient, regardless of whether the accessory 1 is connected to its own external power source 50 or is connected to a common external power source 50 shared by other accessories 1.

Figure 4:
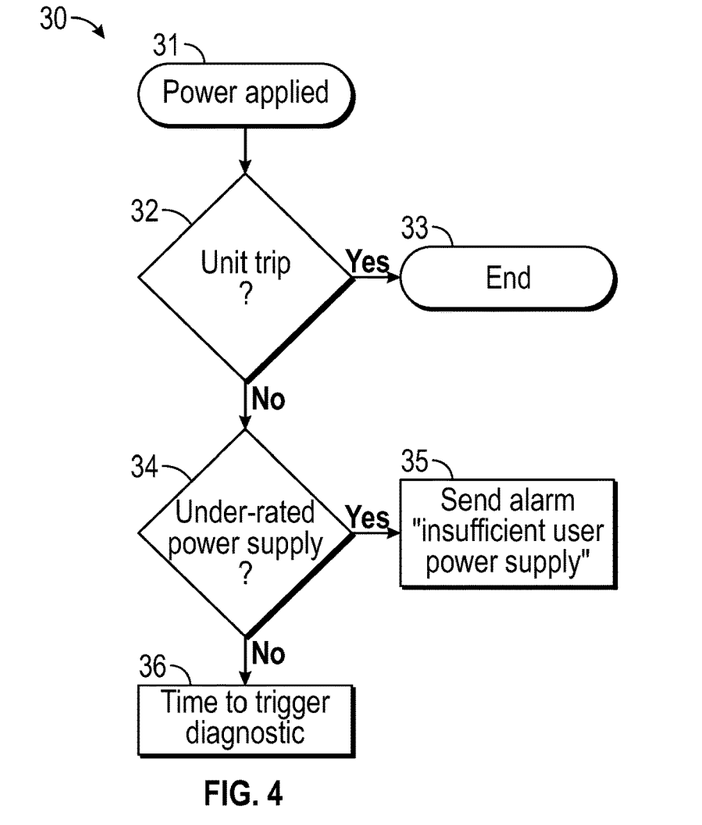
FIG. 4 is a flow chart containing the steps of an applied power diagnostic executed by a control section of the accessory device shown in FIG. 1 in accordance with an exemplary embodiment of the disclosed concept.

Certain types of accessories 1 require a constant power supply. Non-limiting examples of such accessories 1 include under voltage release devices, or shunt trip and spring release devices that are activated based on communication commands. Referring to FIG. 4, in accordance with an exemplary embodiment of the disclosed concept, the processor 4 (shown in FIG. 1) in the control section 3 of each accessory 1 executes an applied power diagnostic 30, represented by the flow chart shown in FIG. 4, to determine if the external power source 50 is meeting the power consumption demands of the accessory 1. It will be appreciated that the processor 4 must constantly execute the applied power diagnostic 30 when power is being applied to the accessory 1.

At step 31 of diagnostic 30, the external power source 50 applies power to the accessory 1. At step 32, the processor 4 determines if the accessory 1 has actuated a trip in the associated circuit breaker, the trip either constituting an opening of the separable contacts (for example and without limitation, in the case of the accessory 1 being a shunt trip or under voltage release device), or a closing of the separable contacts (for example and without limitation, in the case of the accessory 1 being a spring release device). If the processor 4 determines at step 32 that the accessory 1 has actuated a trip, that particular diagnostic cycle ends at step 33 (and returns to step 31 if power is still being applied to the accessory 1 as explained above). If, however, the processor 4 determines at step 32 that the accessory 1 has not actuated a trip, the diagnostic proceeds to step 34.

At step 34, the processor 4 determines, based on the voltage sensed by the voltage sensor 7 (shown in FIG. 1) whether the external power source 50 is under-rated for meeting the power requirements of the accessory 1, i.e. whether the external power source 50 producing power of a lesser magnitude than is required by the accessory 1 to actuate the operating mechanism of the associated circuit breaker. If the processor 4 determines that the external power source 50 is indeed supplying less power than the accessory 1 requires, the processor 4 triggers an alarm at step 35 indicating to the user that the external power source 50 is insufficient for meeting the needs of the accessory 1. The alarm can comprise, for example and without limitation, a sound notification such as a beep, a visual notification such as a toggled sticker display or an illuminated LED, or a notification sent to a remote device via wireless communication. It will be appreciated that the trip unit 100 can be programmed with software to have wireless communication (or other communication) capability, and that a trip unit 100 so programmed transmits a notification to the remote device after receiving a message from the processor 4 on the bus 5 indicating that an alarm condition exists. If, however, the processor 4 determines that the power supplied by the external power source 50 is of sufficient magnitude to meet the power requirements of the accessory 1, then the diagnostic 30 proceeds to step 36 to commence execution of a trigger time diagnostic 40, as depicted by the flow chart shown in FIG. 6.

Figure 5A:
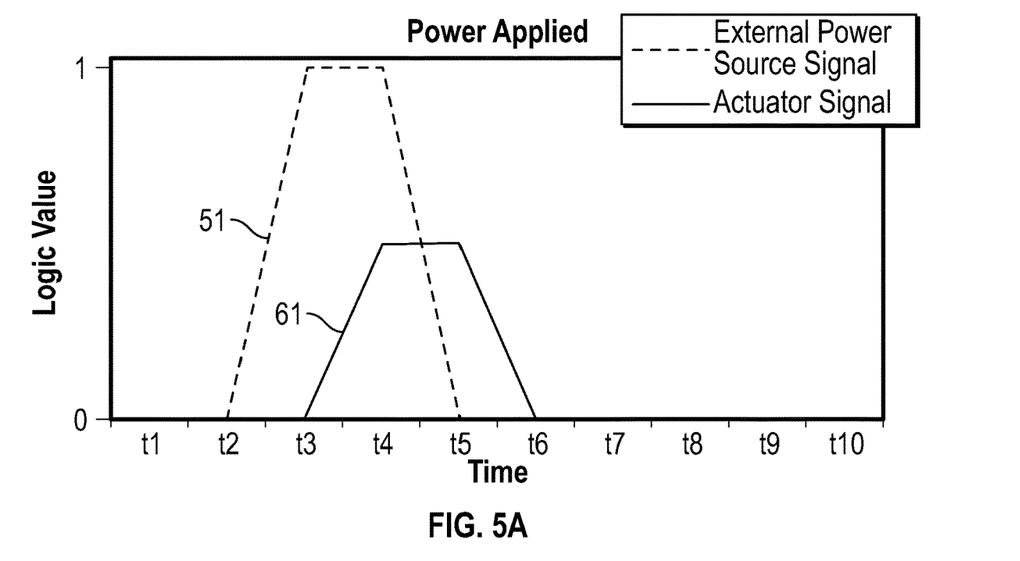
FIG. 5A is a graph of a power signal provided by an external power source to the accessory device shown in FIG. 1, wherein the duration of the external power source signal is insufficient for actuating the accessory device.
Figure 5B:
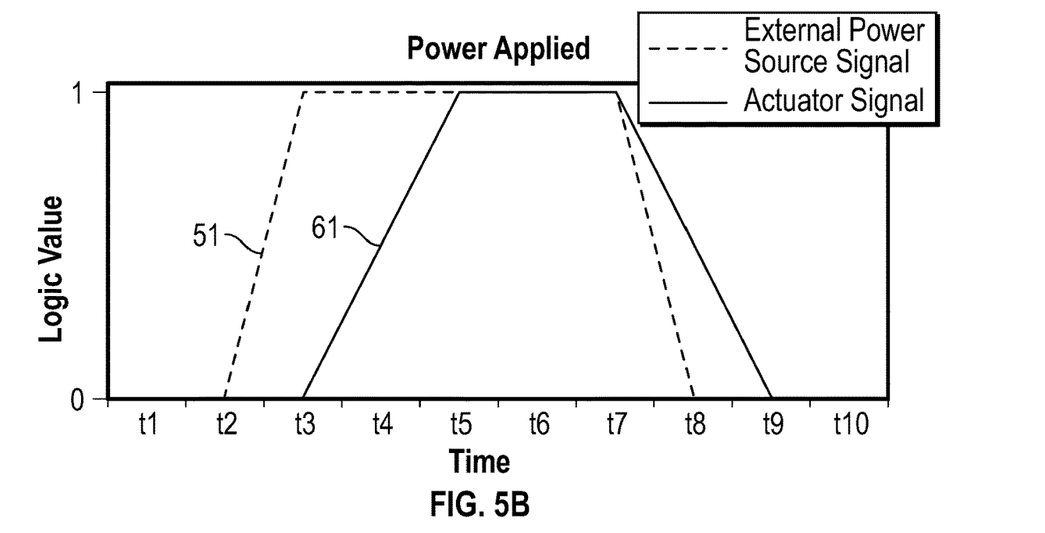
FIG. 5B is a graph of a power signal provided by an external power source to the accessory shown in FIG. 1, wherein the duration of the external power source signal is sufficient for actuating the accessory device.

Referring to FIGS. 5A and 5B, in order for the external power source 50 to sufficiently meet the power requirements of the accessory 1, the duration of the power signal provided by the power source 50 must be long enough to overlap with the response time of the accessory 1 actuator. FIGS. 5A and 5B show graphs of a power signal 51 provided by the external power source 50 and the signal 61 of the power produced in the accessory 1 actuator after receiving power from the external power source 50. Logic 0 and logic 1 on the y-axis of the graphs shown in FIGS. 5A and 5B represent the accessory 0 being OFF and ON, respectively. The duration of the power signal 51 supplied by the external power source 50 shown in FIG. 5A is too short to enable the accessory power signal 61 to reach logic 1 and turn the accessory 1 actuator ON, while the duration of the power signal 51 supplied by the external power source 50 shown in FIG. 5B is sufficiently long that the accessory power signal 61 reaches logic 1 and causes the accessory 1 actuator to turn ON and actuate the operating mechanism of the associated circuit breaker. The trigger time diagnostic 40 executed by the processor 4 in accordance with an exemplary embodiment of the disclosed concept and depicted by the flow chart shown in FIG. 6 determines whether the power signal 51 supplied by the external power source 50 is sufficient to turn the accessory ON as shown in FIG. 5B or insufficient as shown in FIG. 5A.

Figure 6:
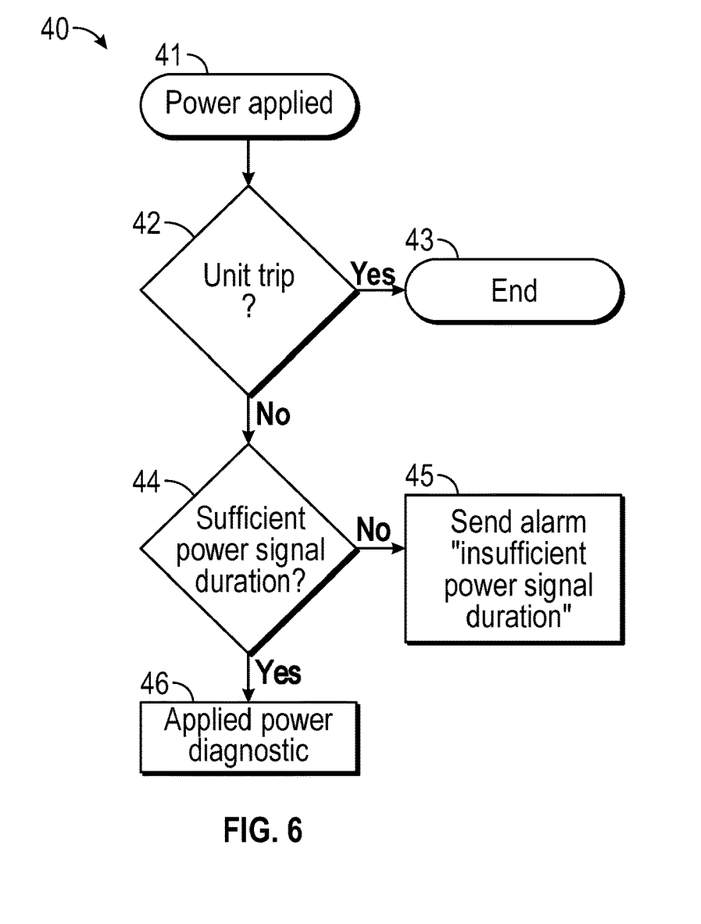
FIG. 6 is a flow chart containing the steps of a trigger time diagnostic executed by a control section of the accessory device shown in FIG. 1 in accordance with an exemplary embodiment of the disclosed concept.

Referring to FIG. 6, at step 41 of the trigger time diagnostic 40, the external power source 50 applies power to the accessory 1. As stated with respect to the applied power diagnostic 30 shown in FIG. 4, it will be appreciated that the processor 4 must constantly execute the trigger time diagnostic 40 when power is being applied to the accessory 1. At step 42, the processor 4 determines if the accessory 1 has actuated a trip in the associated circuit breaker (as previously described with respect to step 32 of the applied power diagnostic 30), the trip either constituting an opening of the separable contacts or a closing of the separable contacts. If the processor 4 determines at step 42 that the accessory 1 has actuated a trip, that particular diagnostic cycle ends at step 43. If, however, the processor 4 determines at step 42 that the accessory 1 has failed to actuate a trip, the diagnostic proceeds to step 44.

At step 44, the processor 4 determines whether the duration of the power signal provided by the external power source 50 to the accessory 1 is sufficient to actuate the accessory 1. If the processor 4 determines that the duration of the power signal provided by the external power source 50 is too short to actuate the accessory 1 (as depicted in FIG. 5A), then the processor 4 triggers an alarm at step 45 indicating to the user that the duration of the power signal provided by the external power source 50 to the accessory 1 is insufficient for actuating the accessory 1. Similarly to the alarm described with respect to step 35 of the applied power diagnostic 30, the alarm can comprise, for example and without limitation, a sound notification such as a beep, a visual notification such as a toggled sticker display or an illuminated LED, or a notification sent to a remote device via wireless communication. If, however, the processor 4 determines that the power signal provided by the external power source 50 is of sufficient duration to enable actuation of the accessory 1 (as depicted in FIG. 5B), then the diagnostic 40 proceeds to step 46 to execute the applied power diagnostic 30 previously described with respect to FIG. 4.

Including the self-diagnostic functionality in the accessory 1 with regard to applied power enables the accessory 1 to immediately alert a user of the associated circuit breaker if the power requirements of the accessory 1 are not being met. This functionality presents several advantages. First, it alerts the user that there is an issue with the accessory 1, as opposed to the circuit breaker. Second, it alerts the user that an accessory 1 malfunction originates with the external power source 50 and/or the wiring between the external power source 50 and the accessory 1 rather than the actuating components of the accessory 1. Third, the continuous evaluation of the sufficiency of the applied power alerts the user of any applied power issues in a timely manner, and can help ensure that any power source issues are addressed at commissioning of an accessory 1 and/or the associated circuit breaker, rather than after the circuit breaker has been placed into service.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A smart accessory device for use with a circuit breaker, the circuit breaker including an operating mechanism and actuating components structured to actuate the operating mechanism, the smart accessory device being separate from the actuating components and operating mechanism and being structured to be operatively coupled to the circuit breaker so as to be able to actuate the operating mechanism, the accessory device comprising:
a power section structured to be electrically connected to a power source, the power section comprising:
an actuator structured to actuate the operating mechanism of the circuit breaker;
a current sensor structured to sense a current provided by the power source to the accessory device; and
a voltage sensor structured to sense a voltage provided by the power source to the accessory device; and
a control section electrically and operatively connected to the power section, the control section comprising a processor,
wherein the power section and the control section are not components of the operating mechanism,
wherein the processor is configured to monitor a power provided by the power source to the accessory device based on information received from the current sensor and based on information received from the voltage sensor,
wherein the processor is configured to determine whether the power provided by the power source to the accessory device is sufficient to enable the accessory device to actuate the operating mechanism of the circuit breaker.

2. The accessory device of claim 1, wherein the device is one of a shunt trip device, a spring release device, or an under voltage release device.

3. The accessory device of claim 1, wherein the actuator comprises a solenoid and a ferromagnetic plunger coupled to the solenoid.

4. The accessory device of claim 1, wherein the processor is configured to trigger an alarm if the control section determines that the power provided to the accessory device by the power source is insufficient to enable the accessory device to actuate the operating mechanism of the circuit breaker.

5. The accessory device of claim 4, wherein the alarm comprises one of a visual notification, a sound notification, or a notification sent to a remote device via wireless communication.

6. The accessory device of claim 1, wherein the processor is configured to determine, in the event of a failure by the accessory device to actuate the operating mechanism of the circuit breaker, whether the failure is due to a magnitude of the power signal provided to the accessory device being insufficient or due to a duration of the power signal provided to the accessory device being insufficient.

7. The accessory device of claim 1,
wherein the processor is configured to continually execute an applied power diagnostic as long as power is supplied to the accessory device,
wherein executing the applied power diagnostic determines whether a magnitude of the power signal provided to the accessory device is sufficient to enable the accessory device to actuate the operating mechanism of the circuit breaker.

8. The accessory device of claim 1,
wherein the processor is configured to continually execute a trigger time diagnostic as long as power is supplied to the accessory device,
wherein executing the trigger time diagnostic determines whether a duration of the power signal provided to the accessory device is sufficient the accessory device to actuate the operating mechanism of the circuit breaker.

9. The accessory device of claim 1,
wherein the processor is configured to continually alternately execute an applied power diagnostic and a trigger time diagnostic as long as power is supplied to the accessory device,
wherein executing the applied power diagnostic determines whether a magnitude of the power signal provided to the accessory device is sufficient to enable the accessory device to actuate the operating mechanism of the circuit breaker,
wherein executing the trigger time diagnostic determines whether a duration of the power signal provided to the accessory device is sufficient the accessory device to actuate the operating mechanism of the circuit breaker.

10. A smart accessory device for use with a circuit breaker, the circuit breaker including an operating mechanism and actuating components structured to actuate the operating mechanism, the smart accessory device being separate from the actuating components and operating mechanism and being structured to be operatively coupled to the circuit breaker so as to be able to actuate the operating mechanism, the accessory device comprising:
a power section structured to be electrically connected to a power source, the power section comprising:
an actuator structured to actuate the operating mechanism of the circuit breaker;
a current sensor structured to sense a current provided by the power source to the accessory device; and
a voltage sensor structured to sense a voltage provided by the power source to the accessory device; and
a control section electrically and operatively connected to the power section, the control section comprising a processor,
wherein the power section and the control section are not components of the operating mechanism,
wherein the processor is configured to monitor a power provided by the power source to the accessory device based on information received from the current sensor and based on information received from the voltage sensor,
wherein the processor is configured to continually execute a number of diagnostics as long as power is being supplied to the accessory device to determine whether the power provided by the power source to the accessory device is sufficient to enable the accessory device to actuate the operating mechanism of the circuit breaker.

11. The accessory device of claim 10, wherein the device is one of a shunt trip device, a spring release device, or an under voltage release device.

12. The accessory device of claim 11, wherein the actuator comprises a solenoid and a ferromagnetic plunger coupled to the solenoid.

13. The accessory device of claim 10, wherein the processor is configured to trigger an alarm if the control section determines that the power provided to the accessory device by the power source is insufficient to enable the accessory device to actuate the operating mechanism of the circuit breaker.

14. The accessory device of claim 12, wherein the alarm comprises one of a visual notification, a sound notification, or a notification sent to a remote device via wireless communication.

15. The accessory device of claim 10, wherein the processor is configured to determine, in the event of a failure by the accessory device to actuate the operating mechanism of the circuit breaker, whether the failure is due to a magnitude of the power signal provided to the accessory device being insufficient or due to a duration of the power signal provided to the accessory device being insufficient.

16. The accessory device of claim 10,
wherein the processor is configured to continually execute an applied power diagnostic as long as power is supplied to the accessory device,
wherein executing the applied power diagnostic determines whether a magnitude of the power signal provided to the accessory device is sufficient to enable the accessory device to actuate the operating mechanism of the circuit breaker.

17. The accessory device of claim 10,
wherein the processor is configured to continually execute a trigger time diagnostic as long as power is supplied to the accessory device,
wherein executing the trigger time diagnostic determines whether a duration of the power signal provided to the accessory device is sufficient the accessory device to actuate the operating mechanism of the circuit breaker.

18. The accessory device of claim 10,
wherein the processor is configured to continually alternately execute an applied power diagnostic and a trigger time diagnostic as long as power is supplied to the accessory device,
wherein executing the applied power diagnostic determines whether a magnitude of the power signal provided to the accessory device is sufficient to enable the accessory device to actuate the operating mechanism of the circuit breaker,
wherein executing the trigger time diagnostic determines whether a duration of the power signal provided to the accessory device is sufficient the accessory device to actuate the operating mechanism of the circuit breaker.

* * * * *